United States Patent
Zeller et al.

(10) Patent No.: US 11,810,227 B2
(45) Date of Patent: Nov. 7, 2023

(54) MR IMAGE RECONSTRUCTION BASED ON A-PRIORI INFORMATION

(71) Applicant: Siemens Healthcare GmbH, Erlangen (DE)

(72) Inventors: Mario Zeller, Erlangen (DE); David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 254 days.

(21) Appl. No.: 17/103,158

(22) Filed: Nov. 24, 2020

(65) Prior Publication Data

US 2021/0158582 A1 May 27, 2021

Related U.S. Application Data

(60) Provisional application No. 62/941,245, filed on Nov. 27, 2019.

(51) Int. Cl.
| | |
|---|---|
| *G06T 11/00* | (2006.01) |
| *G06T 7/73* | (2017.01) |
| *G06T 7/60* | (2017.01) |
| *G01R 33/565* | (2006.01) |
| *G01R 33/56* | (2006.01) |

(52) U.S. Cl.
CPC ........ *G06T 11/006* (2013.01); *G01R 33/5608* (2013.01); *G01R 33/56545* (2013.01); *G06T 7/60* (2013.01); *G06T 7/73* (2017.01); *G06T 11/005* (2013.01); *G06T 2207/10088* (2013.01); *G06T 2207/20084* (2013.01); *G06T 2207/30004* (2013.01); *G06T 2207/30204* (2013.01)

(58) Field of Classification Search
CPC . G06T 11/006; G06T 7/60; G06T 7/73; G06T 11/005; G06T 2207/10088; G06T 2207/20084; G06T 2207/30004; G06T 2207/30204; G01R 33/5608; G01R 33/56545
See application file for complete search history.

(56) References Cited

U.S. PATENT DOCUMENTS

| | | | | |
|---|---|---|---|---|
| 8,781,243 | B2 * | 7/2014 | Chen | ............ G06T 11/005 382/131 |
| 8,886,283 | B1 * | 11/2014 | Chen | ............ A61B 5/4064 382/128 |
| 10,603,113 | B2 * | 3/2020 | Lang | ............ A61B 90/37 |

(Continued)

OTHER PUBLICATIONS

Zeiss IOLMaster 700, SWEPT Source OCT biometer: https://www.zeiss.com/meditec/us/products/ophthalmology-optometry/cataract-portfolio/optical-biometers/iolmaster-700.html—Prior to Nov. 27, 2019.

(Continued)

*Primary Examiner* — Shefali D Goradia

(74) *Attorney, Agent, or Firm* — Banner & Witcoff Ltd.

(57) ABSTRACT

In a system and method for performing MR image reconstruction based on acquired MR measurement data of an organ structure of a patient, the MR measurement data of the organ structure is received, a-priori information about the organ structure from which the MR measurement data have been acquired is received, MR image reconstruction is performed based on the MR measurement data and taking into account the a-priori information, and the reconstructed MR image data is provided.

20 Claims, 4 Drawing Sheets

(56) References Cited

U.S. PATENT DOCUMENTS

| | | | |
|---|---|---|---|
| 10,803,631 B2* | 10/2020 | Li | G06N 3/08 |
| 11,229,362 B2* | 1/2022 | Ben-Haim | A61B 5/4041 |
| 11,269,036 B2* | 3/2022 | Epstein | G01R 33/56545 |
| 2012/0177267 A1* | 7/2012 | Chen | G06T 11/005 |
| | | | 382/131 |
| 2013/0034203 A1* | 2/2013 | Wang | A61B 6/5247 |
| | | | 378/62 |
| 2018/0078318 A1* | 3/2018 | Barbagli | G06T 7/0012 |
| 2020/0405176 A1* | 12/2020 | Nielsen | G01R 33/482 |

OTHER PUBLICATIONS

Weizman L. et al., "Reference-based MRI", MedPhys, pp. 5357-5369, 2016, doi 10.1118/1.4962032.

Haldar, et al., Anatomically constrained reconstruction from noisy data, Magn. Reson. Med., vol. 59, No. 4, pp. 810-818; 2008.

Dar, S. et. al., "Image Synthesis in Multi-Contrast MRI with Conditional Generative Adversarial Networks", arXiv:1802 01221, 2018.

\* cited by examiner

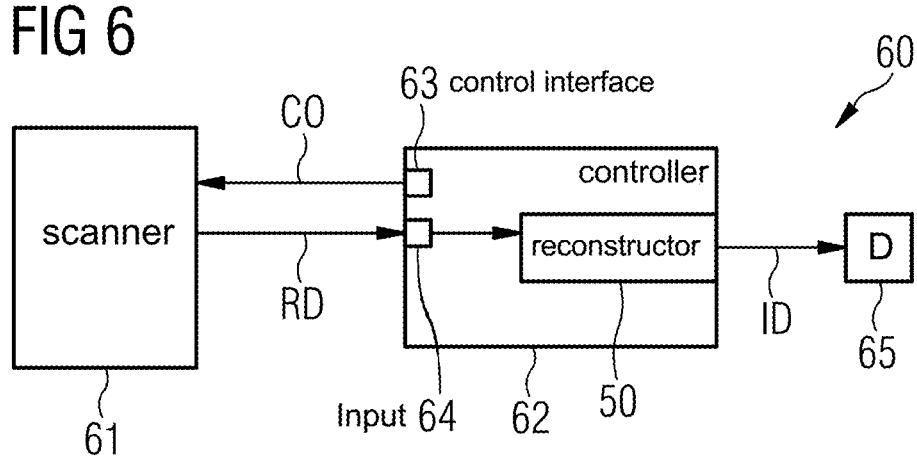

MR IMAGE RECONSTRUCTION BASED ON A-PRIORI INFORMATION

CROSS REFERENCE TO RELATED APPLICATIONS

This patent application claims priority to, and the benefit of, U.S. Provisional Patent Application No. 62/941,245, filed Nov. 27, 2019, which is incorporated herein by reference in its entirety.

BACKGROUND

Field

The disclosure concerns a method of reconstructing a magnetic resonance (MR) image. Further, the disclosure concerns a reconstruction device. Furthermore, the disclosure concerns an MR-system.

Related Art

Magnetic Resonance Imaging (MRI) is a non-invasive imaging modality that can produce high resolution, high contrast images of the interior of a subject. MRI involves the interrogation of the nuclear magnetic moments of a sample placed in a strong magnetic field with radio frequency magnetic fields. During MRI the subject, typically a human patient, is placed into the bore of an MRI machine and is subjected to a uniform static polarizing magnetic field $B_0$ produced by a polarizing magnet housed within the MRI machine. Radio frequency pulses, generated by RF coils housed within the MRI machine in accordance with a particular localization method, are typically used to scan target tissue of the patient. MRI signals are radiated by excited nuclei in the target tissue in the intervals between consecutive RF pulses and are sensed by the RF coils. During MRI signal sensing, gradient magnetic fields are switched rapidly to alter the uniform magnetic field at localized areas thereby allowing spatial localization of MRI signals radiated by selected slices of the target tissue. The sensed MRI signals are in turn digitized and processed to reconstruct images or the target tissue slices using one of many known techniques.

When a substance, such as human tissue is subjected to the static polarizing magnetic field $B_0$, the individual magnetic moments of the spins of hydrogen nuclei in the tissue attempt to align with the static polarizing magnetic field $B_0$, but precess about their axes in random order at their characteristic Larmor frequency. The net magnetization vector lies along the direction of the static polarizing magnetic field $B_0$ and is referred to as the equilibrium magnetization $M_0$. In this configuration, the Z component of the magnetization or longitudinal magnetization $M_Z$ is equal to the equilibrium magnetization $M_0$. If the target tissue is subjected to an excitation magnetic field $B_1$, which is in the x-y plane and which is near the Larmor frequency, the longitudinal magnetization $M_Z$ may be rotated, or "tipped" into the x-y plane to produce a net transverse magnetic moment $M_{XY}$. When the excitation magnetic field $B_1$ is terminated, relaxation of the excited spins occurs, with a signal being emitted that effects the magnitude of radiated MRI signals. The emitted signal is received and processed to form an image. One important issue of an MR imaging process is the time needed to perform the acquisition of a complete data set of a region of interest that to be imaged. Particularly if a highly resolved image of an extensive region is needed, the time for acquisition of the raw data and for computing the image data based on raw data is very long. Hence, the acquisition of such an MR image can be very time-consuming and expensive due to the high personal costs for the specialists required for operation of an MR-system. Therefore, some approaches for reducing the effort of acquisition of raw data, for example compressed sensing have been developed.

Compressed sensing is a signal processing technique for efficiently acquiring and reconstructing a signal, for example an MR measurement signal, by finding solutions to underdetermined linear systems. Compressed sensing is based on the consideration that a signal can be acquired with fewer samples than required by a Nyquist-Shannon sampling theorem, if the sparsity of the signal is exploited by an optimization process. In addition to sparsity, the signal must be sufficiently incoherent. However, there is a need for some additional information to be able to perform such an optimization process.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
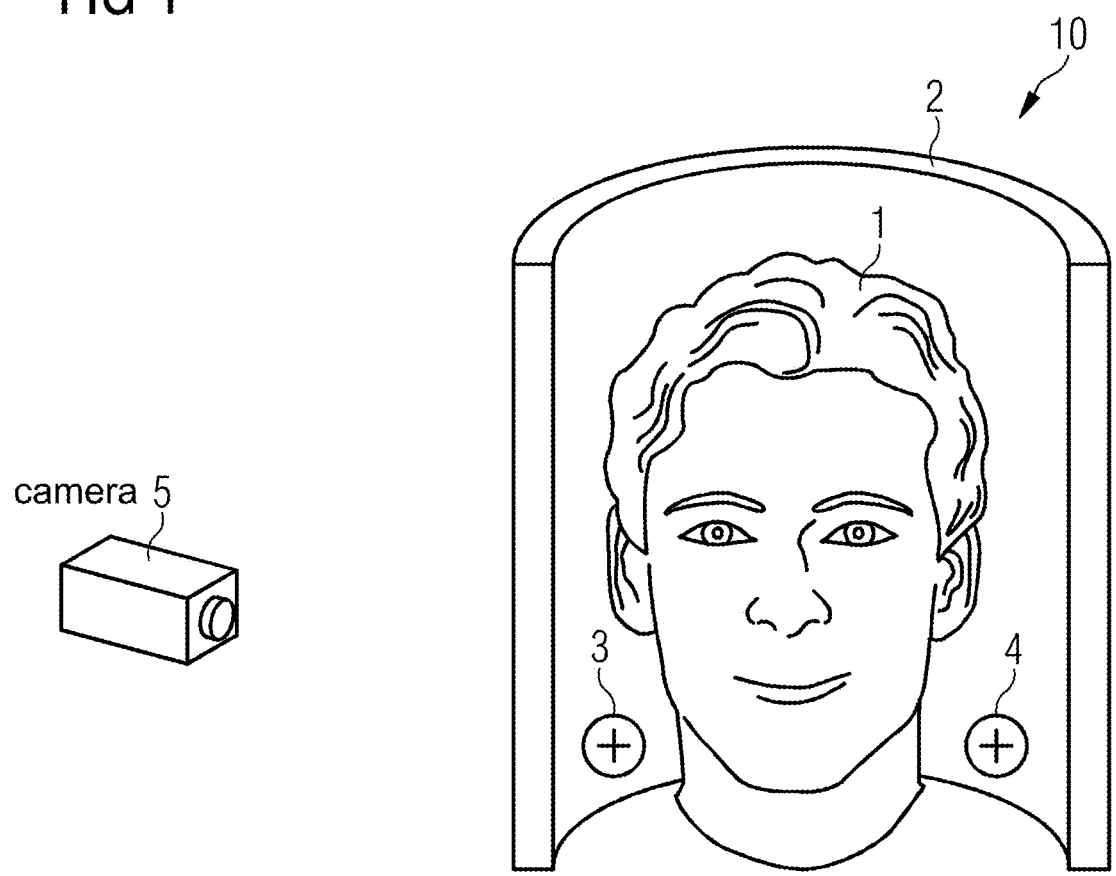
FIG. 1 shows a perspective view of an arrangement for combining MRI-Data and optical data, according to an exemplary embodiment of the present disclosure.

FIG. 6 a MR-system according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide a method and a device for reconstructing MR image data at higher speed and/or requiring less computation effort than conventional methods.

According to the disclosure, a method is provided for performing an MR image reconstruction based on acquired MR measurement data of an organ structure of a patient is provided. MR measurement data are defined as the raw data, also referred to as k-space data. According to the inventive method, the MR measurement data of the organ structure are received. A-priori information about the organ structure from which the MR measurement data have been acquired is also received. The a-priori information is defined as information about the organ or organ structure to be imaged, which has been acquired or created prior to the MR measurement. Such information can be geometrical information about the shape or symmetry of the organ or organ structure to be imaged. Further, an MR image reconstruction is performed based on the MR measurement data and taking into account the a-priori information. Then the reconstructed MR image data is provided to a user.

The disclosure is about using a-priori information for MR image reconstruction for MR imaging, especially of easily accessible organs. Easily accessible organs can be for example teeth, breasts, joints or eyes. For these organs using the method according to the disclosure dental imaging of the jaw or teeth of a patient, mammography imaging of the breast of a patient (at least regarding the surface of the organ), orthopedics imaging of joints (e.g. knee, shoulder, elbow, hand, foot) of a patient (at least regarding the surface of the organ) and ophthalmologic imaging of the eye of a patient can be realized.

In general, a-priori information for MR image reconstruction can be generated using different technical means as later described in detail.

The a-priori information can be used during MR image reconstruction to mask not-interesting regions acquired using MR images as background and using the mask during MR image reconstruction. The mask can be generated based on an anatomical model, which is generated based on the a-priori information.

Further, a-priori information can be used directly for reconstruction as an additional information to the measurement data. For example the acquisition of the measurement data can be performed with a lower data density and the reduction of information can be compensated by the a-priori information. Advantageously, the MR measurement process can be finished in a shorter time due to the reduced amount of raw data, which have to be acquired.

Furthermore, a-priori information may also be used as information about the structural content of the imaged region, which allows for a patient-specific setup of imaging and reconstruction parameters. For example, the measurement trajectory, the image acceleration, the regularization parameters and the sparsity transformations can be adapted to the structural content. Advantageously, the reconstruction parameters can be adapted to the a-priori information of an organ to be imaged, which results in a better image quality or reduced data amount to be acquired and hence a reduced measurement time.

The disclosure also provides a reconstruction device. The reconstruction device comprises an MR data receiver for receiving the MR measurement data of an organ structure and an a-priori data acquisition unit for receiving a-priori information about the organ structure, from which the MR measurement data have been acquired. Further, the reconstruction device includes a reconstruction unit for performing MR image reconstruction based on the MR measurement data and taking into account the a-priori information and an output unit for providing the reconstructed MR image data. The reconstruction device shares the advantages of the method according to the disclosure.

Furthermore, the disclosure provides an MR system, which encompasses an MR measurement data acquisition unit for acquiring MR measurement data for an organ structure and the reconstruction device according to the disclosure for reconstructing MR image data based on the MR measurement data acquired by the MR measurement data acquisition unit. The MR system shares the advantages of the reconstruction device according to the disclosure.

According to a variation of the method of the disclosure receiving a-priori information further comprises receiving optical image data acquired from the organ structure and generating a-priori information based on the optical image data.

Optical imaging can be performed using at least one camera. Optical image data are also possible provided using a stereo-camera setup. The advantage of the use of a stereo camera is the possibility of acquiring 3D data that is useful for registration onto MR imaging data, which are also 3D data. Optical data may also comprise direct information about the organ to be imaged, e.g. teeth, or information about the surface and the volumetric extent of the organ to be imaged (e.g. knee, shoulder, etc.). Further, based on color coding, image brightness or computer vision algorithms, different organ regions can be distinguished (e.g. teeth from tissue). An infrared camera might also be utilized to distinguish between organ regions based on temperature, e.g. for differentiation of teeth from tissue. Based on the position and extension of the region to be imaged, the measurement can be concentrated on the region to be imaged and hence, the amount of measurement data can be reduced and the measurement time can also be reduced compared to a conventional approach, which includes the acquisition of measurement data also from regions which are of no interest for the medical examination.

The optical images can be employed for facial feature registration. Such a registration step enables speed up of reconstruction or adaption of reconstruction parameters or masking of parts of a region that are of no relevance interesting for the examination.

Masking of the front of the teeth is also possible based on optical images.

In a method of an exemplary embodiment of the disclosure, the step of receiving a-priori information comprises detecting optical markers based on optical image data, preferably at least to two markers. Advantageously, these optical markers can be used for registration of a-priori information and reconstruction data.

In a dental imaging procedure, certain distinct teeth can be localized using optical imaging and models of the teeth can be employed for MR image reconstruction. The optical sensor, e.g. a camera, can be positioned in the intraoral region, for example together with field generating unit (field generator) of the MR scanner. If images of the teeth are acquired with a stereo camera setup, which can be either fixed to the scanner or can be portable and be guided by the operator, volumetric information can be obtained and used as described above. In a mammographic procedure, optical measurement methods can provide prior information on breast volume, which can be utilized for masking MR images or as prior information about object geometry for reconstruction MR image data.

In an exemplary embodiment, the step of performing MR image reconstruction based on the MR measurement data and taking into account the a-priori information comprises a registration of reconstructed MR images and a-priori information. The registration enables the direct transfer of the information of a-priori data to reconstructed image data.

Furthermore, in an exemplary embodiment, the method according to the disclosure may include a step of acquiring a localizer dataset, which may be based on MR system components.

In an exemplary embodiment, the step of acquiring a localizer dataset is based on one of the following acquisition methods:

a three-plane low resolution acquisition resulting in a low resolution 3D dataset, a projection acquisition comprising only non-phase encoded k-space lines in different image orientations.

The localizer dataset enables to transfer the a-priori information to an MR system. The localizer datasets are MR images, which serve to acquire the location information from MR active markers. The markers are also visible in the optical image data and can be detected in both data sets. By co-registration of the markers in both data sets, a transformation matrix can be calculated, which enables the use of optical data as a-priori information for the following MR imaging of a patient.

As described above, the method according to the disclosure comprises the step of detecting locations of the MR components of the optical markers from the localizer dataset. For example, prior to MR reconstruction of an image of a patient, registration of a-priori information comprising marker information and localizer dataset comprising marker information can be performed, wherein marker information is aligned to obtain transformation matrices between the optical image data and the localizer dataset.

In an exemplary embodiment, at least two markers are used, which are detectable by the camera as well as by the MR system. The markers, which can include e.g. Vitamin E or short T1 oils marked with a specific optical pattern, are either fixed to a field-generating unit or attached to the patient. This special setup facilitates spatial registration in the reconstruction step.

In an exemplary embodiment of the disclosure, the step of registration of reconstructed MR images and a-priori information comprises an image registration method without markers, preferably a standard image registration method without markers. Hence, the step of creating markers in the optical data and the step of transferring the markers to a localizer data set can be omitted.

The step of receiving a-priori information of the method according to the disclosure may further comprise receiving previously acquired MR image data acquired from another organ structure of the patient, which is symmetrically aligned to the organ structure, and generating the a-priori information based on the previously acquired MR image data.

Furthermore, the step of receiving a-priori information of the method according to the disclosure may comprise receiving previously acquired image data acquired from the organ structure to be imaged using a different imaging modality than MR imaging and generating a-priori information based on the previously acquired image data. For example, prior images can be obtained by X-ray images and techniques for X-ray and MRI registration can be employed for aligning the images. This information is especially helpful, if an MR image reconstruction is performed in a projection-based fashion. In that case, 2D image data is sufficient for registration of a-priori information onto the MR image.

Further, the step of receiving a-priori information of the method according to the disclosure may also comprise receiving data describing an outer surface of the organ structure and generating a-priori information based on the data describing the outer surface of the organ structure. The outer surface can be used as limitation face of a volume from which measurement data have to be acquired. Advantageously the imaging volume can be restricted and the amount of time for measurement can be reduced.

In case of a symmetric body region being imaged, an MR multi-part measurement with different data densities can be performed based on a-priori information about image space symmetry. Advantageously the amount of data, which have to be acquired by MR measurement, can be reduced.

In an alternative embodiment of the method, a-priori information is used:

for providing ground truth information about a shape of an object to be imaged and using ground truth information for solving a penalty term, which is used for reconstructing MR image data based on undersampled k-space data.

Acquiring undersampled k-space data reduces the amount of data to be acquired by MR measurement. Hence, less time for MR measurement data acquisition is required compared to a completely sampled k-space acquisition.

In an exemplary embodiment of the method:

a first measurement is performed on a first half body region using complete data acquisition density and a second measurement is performed on a second half body region using less data acquisition density and data from the first measurement step based on a-priori information about image space symmetry.

Using less acquisition density reduces the measurement time, which is necessary for the whole measurement. For example, the acquired data of the first measurement of the first half body region can be used as ground truth for solving a penalty term, which is used for reconstructing MR image data of the second half body region based on undersampled k-space data. Hence, time for reconstruction of the second half body can be reduced compared to a complete sampling of k-space data.

A-priori information may also provide mechanical models of the region to be imaged, for example mechanical impressions or mechanical models, which fit to the surface of the region to be imaged. For example mechanical models can be based on a dental impression of the set of teeth of the patient. Such dental impression can be scanned and used to develop a mask or as prior information for reconstruction.

In an exemplary embodiment, a-priori information also includes information which does not comprise complete 2D or 3D information about the image region, but comprises at least certain geometric features or dimensions of organs.

In a method according to an exemplary embodiment, a-priori information is used as input for a convolutional neural network, for example for a generative adversarial network, to perform an MR image reconstruction. For example, a-priori information can be used as additional ground truth input together with MR data into a convolutional neural network performing an image reconstruction. A-priori information can also be fed into a generative adversarial network to create an initial synthetic MR image based on that information alone. This image can then be used as ground truth for any type of image reconstruction.

Further, a-priori information can be used for a conventional anatomically constrained reconstruction method for reconstruction of MR images. Such constrained reconstruction method are for example described in Haldar et al., MRM, 2008, doi 10.1002/mrm.21536. The constraints used by these approaches are typically derived from co-registered high-resolution anatomical datasets and include features such as tissue boundary locations and regions of support. All these methods have the same goal, namely to combine high-resolution prior information with low-resolution high-SNR data to obtain high-resolution reconstructions.

FIG. 1 illustrates an embodiment utilizing optical information. A patient 1 is placed in an MR system 2 comprising at least a field generating unit (FGU) (also known as the field generator) and local receive coils. A camera 5 is placed such that the patient 1 is within the camera's field of view (FOV). In an exemplary embodiment shown in FIG. 1, at least two markers 3, 4, which are detectable by the camera 5 as well as by the MR system 2 (the markers can be include e.g. Vitamin E or short T1 oils marked with a specific optical pattern) are either fixed to the FGU or attached to the patient 1. This special setup facilitates spatial registration in the reconstruction step. If the optical pattern comprises depth information, two markers are sufficient for 3D registration, otherwise at least three markers are required for accurate registration.

Figure 2:
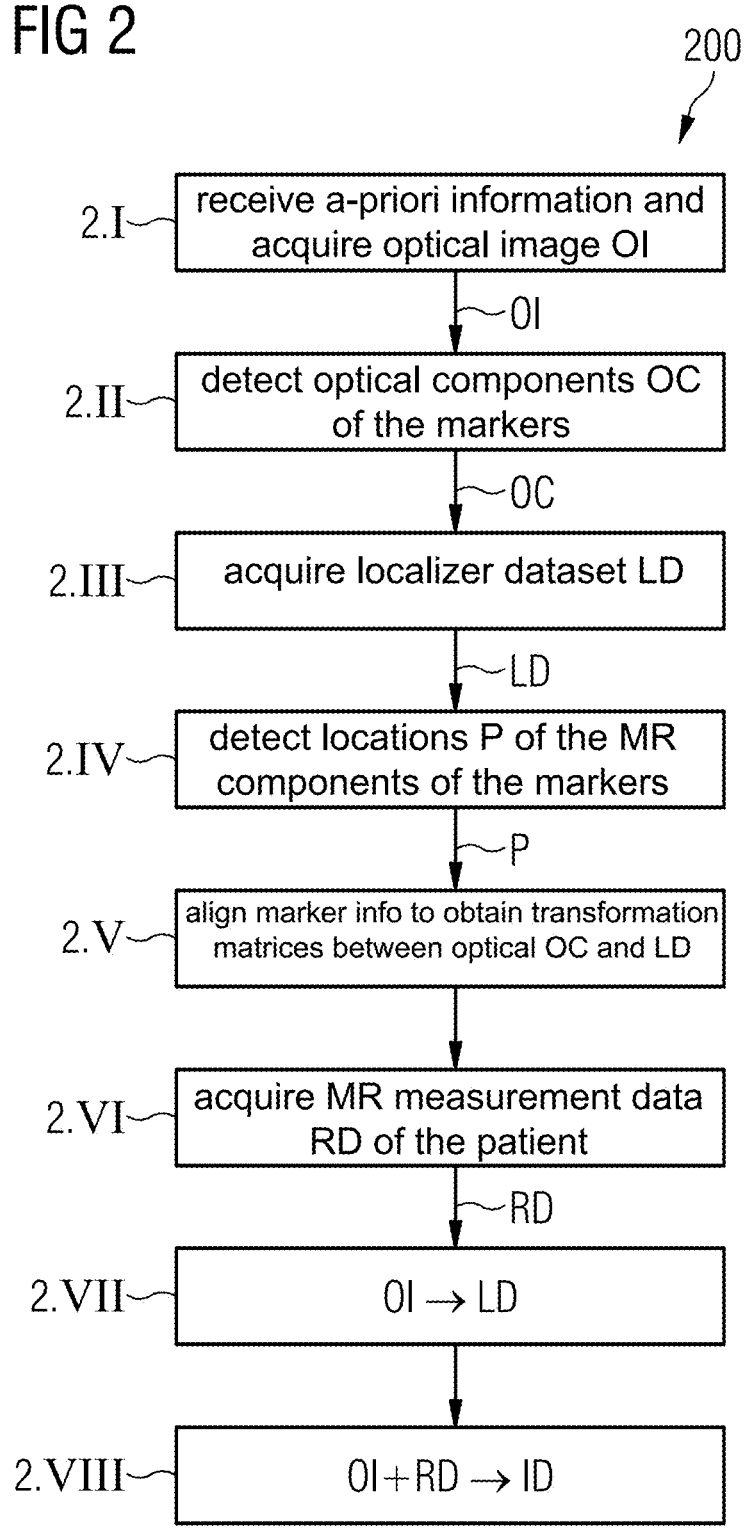
FIG. 2 shows a flowchart of a MR image reconstruction method according to an exemplary embodiment of the present disclosure.

In FIG. 2 a flow diagram 200 visualizing a method for performing MR image reconstruction based on acquired MR measurement data RD of an organ structure of a patient according to an embodiment of the disclosure is shown.

First, in step 2.I, a step of receiving a-priori information, an optical image OI is acquired with the camera 5. The step of receiving a-priori information may also comprise receiving data describing an outer surface of an organ structure of a patient 1 and generating a-priori information based on the data describing the outer surface of the organ structure. The outer surface can be used as limitation face of a volume from which measurement data have to be acquired. Advantageously the imaging volume can be restricted and the amount of time for measurement can be reduced.

Optical components OC of the markers 3, 4 are detected in a subsequent step 2.II. Afterwards, in step 2.III a localizer dataset LD is acquired utilizing the MR system components. This localizer LD can for example be acquired as a three-plane low resolution acquisition, a low resolution 3D dataset or as a projection acquisition comprising only non-phase encoded k-space lines in different image orientations. In a next step 2.IV, the locations P of the MR components of the markers 3, 4 are detected from the MR data. In a subsequent step 2.V, both marker information is aligned to obtain transformation matrices between optical OC and MR datasets LD. In a next step 2.VI, MR measurement data RD of the patient are acquired. For image reconstruction, at step 2.VII, the optical data OI are registered onto the MR measurement data RD utilizing the transformation matrices obtained in step 2.V. In a final step 2.VIII, MR image reconstruction is performed, i.e. image data ID are reconstructed utilizing prior information AI of the optical images OI. It has to be noted that the steps 2.II to 2.V, which deal with registration of reconstructed MR images ID and a-priori information AI, may alternatively comprise an image registration method without markers.

Further, a-priori information may also be used as input for a convolutional neural network to perform an MR image reconstruction.

Figure 3:
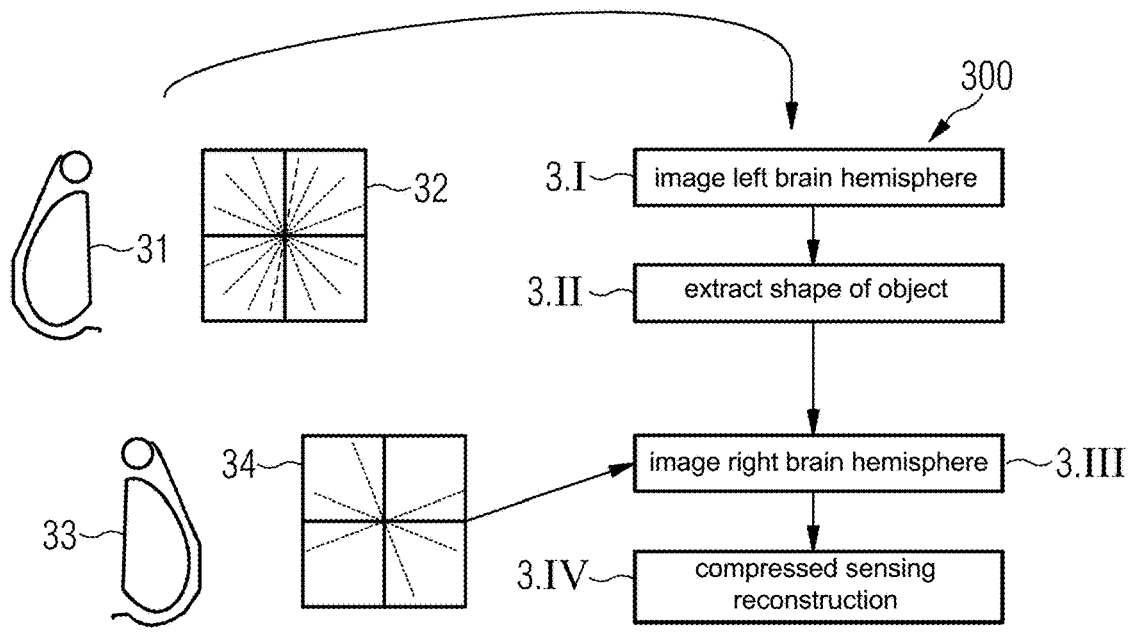
FIG. 3 shows a schematic view of a combination of MRI-data acquired using different sampling rate and sampling density, according to an exemplary embodiment of the present disclosure.

In FIG. 3 an embodiment of the method according to the disclosure is visualized, wherein symmetric body regions are imaged and prior information about image space symmetry is utilized. This can be especially beneficial in case that the field of view is not sufficient to image the entire region in one step, but a multi-station measurement, also named multi-part measurement, has to be performed (e.g. first and second eye in two steps or left and right breast in one step). In this case, the second step can be scanned with less acquisitions and data from the first step in conjunction with prior knowledge about the symmetry in image-space can be incorporated into the reconstruction.

Also a flow diagram 300 of a potential image reconstruction workflow is shown in FIG. 3. At first step 3.I, a left brain hemisphere 31 is imaged by an MR-Imaging process 32 comprising complete density of sampled k-space. Then at step 3.II the shape of an object to be imaged is extracted and the image is expanded to the right brain hemisphere 33. At step 3.III the right hemisphere is acquired using an MR imaging method, however the right hemisphere is under-sampled in k-space. Then at step 3.IV a compressed sensing reconstruction is performed on the right brain hemisphere 33 based on the information of the left hemisphere 31 and the undersampled raw data i.e. k-space data RD of the right brain hemisphere 33. Based on the ground truth information about the object shape of the right brain hemisphere 33, a penalty term (1) can be formulated for calculating the wanted image data x:

$$\min_{x} \| F_u x - y \|_2^2 + \lambda \| x - x_0 \|_1, \quad (1)$$

whereby y is the acquired k-space data, $F_u$ is the undersampled Fourier transform operator, x the complex MR image to be reconstructed, $\lambda$ an arbitrary factor and $x_0$ is the image data provided by the information of the first acquisition of the left brain hemisphere and $\| \|_1$ is the $L^1$-norm and $\| \|_2$ is the $L^2$-norm.

Further, the information about the structural content of the imaged right hemisphere allows for a patient-specific setup of imaging and reconstruction parameters, for example the measurement trajectory, the image acceleration and the regularization parameters and sparsity transformations. For example if the acquired image is sparser, the acceleration can be higher.

Figure 4:
FIG. 4 shows an image of a combined biometry and keratometry measurement according to an exemplary embodiment of the present disclosure.

In FIG. 4 an ophthalmological measurement method is shown for acquiring a-priori information for imaging an eye 40. Even though only the surface profile of the face is accessible by optical methods, an approximate anatomical prior image can be created by assuming a cylindrical shape of the eyeballs and performing a spatial registration of an anatomical atlas image to the acquired surface.

Prior information can be obtained from ophthalmological measurement methods, which typically do not provide images of the entire organ, but at least of parts of it, or specific geometric information such as the anterior and/or posterior surface and curvature of the cornea 41. Such methods can comprise biometry, keratometry or optical coherence tomography. FIG. 4 shows a combined biometry and keratometry measurement of one eye 40. Based on this data various improvements for an MR reconstruction can be conceived, for example a simple anatomical initial synthetic MR model can be created utilizing a GAN or an anatomical and geometrical information can be obtained to customize a penalty term for compressed sensing or conventional imaging or to derive assumptions on image sparsity for a compressed sensing reconstruction. An example for the use of a generative adversarial network (GAN) is described in Salman UI Hassan Dar et al. "Image Synthesis in Multi-Contrast MRI with Conditional Generative Adversarial Networks", submitted to IEEE Transaction on Medical Imaging. In FIG. 4, parts of the lens 43 and iris 42 and the retina 44 are also shown.

Figure 5:
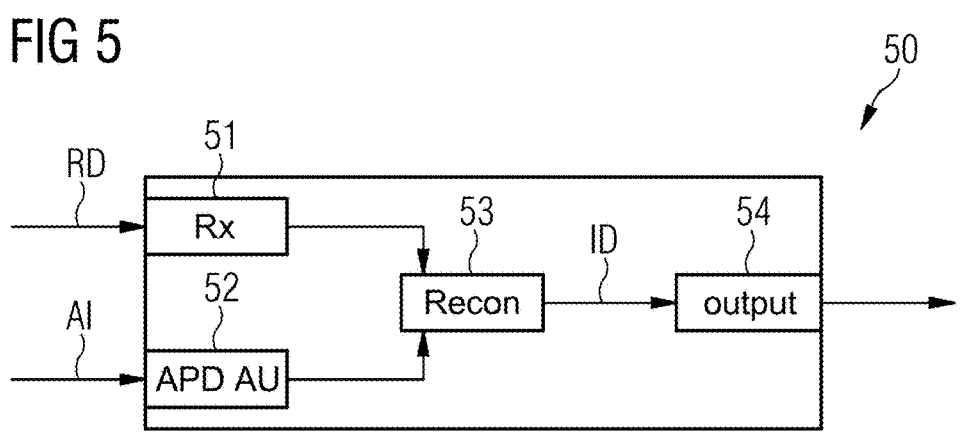
FIG. 5 shows a reconstruction device according to an exemplary embodiment of the present disclosure.

In FIG. 5, there is depicted a reconstruction device 50 according to the disclosure. The reconstruction device 50 comprises an MR data receiver 51 for receiving the MR measurement data RD of an organ structure. Further, the reconstruction device 50 includes an a-priori data acquisition unit 52 (a-priori data receiver) configured to receive a-priori information AI about the organ structure from which the MR measurement data RD have been acquired. The a-priori information AI and the MR measurement data RD are transmitted to a reconstruction unit (reconstructor) 53, which is also part of the reconstruction device 50. The reconstruction unit 53 is designed for performing MR image reconstruction data ID based on the MR measurement data RD and taking into account the a-priori information AI. Then the image data ID are output by an output unit 54 for providing the reconstructed MR image data ID for further examination.

In FIG. 6 an MR system 60 according to an embodiment of the disclosure is depicted. The MR system 60 comprises an MR measurement data acquisition unit 61, also referred as a scanner 61, which is used for acquiring MR measurement data RD from an organ structure of a patient. Further, the MR system 60 also comprises a controller 62 for controlling the scanner 61 by transmitting control orders CO to the scanner 61 through a control interface 63. The controller 62 also comprises an input interface 64 for receiving raw data RD, acquired from the organ structure of the patient, from the scanner. Furthermore, the MR system 60 also comprises the reconstruction device 50 according to the disclosure, depicted in FIG. 5. Image data ID reconstructed by the reconstruction device 50 are transmitted to a display unit 65 for visualizing the image data ID. In an exemplary embodiment, the controller 62 includes processor circuitry that is configured to perform one or more functions and/or operations of the controller 62, including controlling the scanner 61.

Although the present disclosure has been disclosed in the form of exemplary embodiments and variations thereon, it will be understood that numerous additional modifications and variations could be made thereto without departing from the scope of the disclosure. For the sake of clarity, it is to be understood that the use of 'a' or 'an' throughout this application does not exclude a plurality, and 'comprising' does not exclude other steps or elements.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST 1 patient
2 MR system
3, 4 markers
5 camera
31 left brain hemisphere
32 MR-Imaging process
33 right brain hemisphere
40 imaged eye
41 cornea
42 iris
43 lens
44 retina
50 reconstruction device
51 MR data receiver
52 a-priori data acquisition unit
53 reconstruction unit (reconstructor)
54 output unit
60 MR system
61 scanner
62 controller
63 control interface
64 input interface
65 display unit
AI a-priori information
CO control order
ID MR image data
OC optical components
OI optical image
LD localizer dataset
P locations
RD MR measurement data/raw data

The invention claimed is:

1. A method for performing a magnetic resonance (MR) image reconstruction based on acquired MR measurement data of an organ structure of a patient generated by an MR measurement, the method comprising:
receiving a-priori information about the organ structure to be imaged, the a-priori information being acquired or created prior to the MR measurement;
receiving the MR measurement data of the organ structure generated by the MR measurement;
performing an MR image reconstruction based on the MR measurement data and the a-priori information; and
providing the reconstructed MR image data as an electronic output signal.

2. The method according to claim 1, wherein receiving a-priori information further comprises receiving optical image data acquired from the organ structure and generating a-priori information based on the optical image data.

3. The method according to claim 1, wherein performing MR image reconstruction comprises a registration of the MR measurement data onto the a-priori information.

4. The method according to claim 3, wherein receiving the a-priori information comprises detecting optical markers based on optical image data.

5. The method according to claim 4, further comprising acquiring a localizer dataset including MR system components.

6. The method according to claim 5, wherein acquiring the localizer dataset is based on one of the following MR acquisition methods: a three-plane low resolution acquisition resulting in a low-resolution third-dimensional (3D) dataset, or a projection acquisition including only non-phase encoded k-space lines in different image orientations.

7. The method according to claim 5, further comprising detecting locations of the MR system components, including locations of the optical markers from the localizer dataset.

8. The method according to claim 5, wherein, prior to performing the MR image reconstruction, performing a registration of a-priori information including a first marker information and the localizer dataset including a second marker information, wherein both the first and the second marker information are aligned to obtain transformation matrices between the optical image data and the localizer dataset.

9. The method according to claim 3, wherein the registration of the reconstructed MR images and the a-priori information comprises an image registration method without markers.

10. The method according to claim 1, wherein the receiving of the a-priori information comprises:
receiving previously acquired MR image data from another organ structure of the patient, the previously acquired MR image data being symmetrically aligned to the organ structure to be imaged, and
generating a-priori information based on the previously acquired MR image data.

11. The method according to claim 1, wherein the receiving of the a-priori information comprises:
receiving previously acquired image data acquired from the organ structure using a different imaging modality than MR imaging, and
generating a-priori information based on the previously acquired image data.

12. The method according to claim 1, wherein the receiving of the a-priori information further comprises:
receiving data describing an outer surface of the organ structure, and
generating a-priori information based on the data describing the outer surface of the organ structure.

13. The method according to claim 1, wherein in response to a symmetric body region being imaged, performing an MR multi-part measurement with different data densities based on a-priori information about image space symmetry.

14. The method according to claim 1, wherein:
based on the a-priori information, providing ground truth information about a shape of an organ structure to be imaged, and
using the ground truth information to solve a penalty term, and using the penalty term to reconstruct MR image data based on undersampled k-space data.

15. The method according to claim 14, wherein:
a first measurement is performed on a first half body region using complete data acquisition density; and
a second measurement is performed on a second half body region using less data acquisition density and data from the first measurement based on a-priori information about image space symmetry.

16. The method according to claim 1, wherein the a-priori information is used as input for a convolutional neural network to perform the MR image reconstruction.

17. A computer program product, embodied on a non-transitory computer-readable storage medium, having a computer program and that is directly loadable into a memory of an MRI device, when executed by a processor of the MRI device, causes the processor to perform the method as claimed in claim 1.

18. A non-transitory computer-readable storage medium with an executable program stored thereon, that when executed, instructs a processor to perform the method of claim 1.

19. A reconstruction device, comprising:
- a magnetic resonance (MR) data receiver for receiving MR measurement data of an organ structure generated from an MR measurement;
- an a-priori data acquisition unit configured to receive a-priori information about the organ structure from which the MR measurement data has been acquired, the received a-priori information being acquired or created prior to the MR measurement;
- a reconstructor configured to perform MR image reconstruction based on the MR measurement data and the a-priori information to generate reconstructed MR image data; and
- an output configured to provide the reconstructed MR image data as an output signal.

20. A magnetic resonance (MR) system, comprising:
- an MR scanner configured to perform an MR measurement to acquire MR measurement data for an organ structure; and
- a controller configured to reconstruct MR image data based on the MR measurement data acquired by the MR scanner, the controller including:
  - a magnetic resonance (MR) data receiver for receiving the MR measurement data of the organ structure from the MR scanner;
  - an a-priori data acquisition unit configured to receive a-priori information about the organ structure from which the MR measurement data has been acquired, the received a-priori information being acquired or created prior to the MR measurement;
  - a reconstructor configured to perform MR image reconstruction based on the MR measurement data and the a-priori information to generate the reconstruct MR image data; and
  - an output configured to provide the reconstructed MR image data as an output signal.

* * * * *